(12) United States Patent
Mansfield et al.

(10) Patent No.: US 6,541,166 B2
(45) Date of Patent: Apr. 1, 2003

(54) METHOD AND APPARATUS FOR LITHOGRAPHICALLY PRINTING TIGHTLY NESTED AND ISOLATED DEVICE FEATURES USING MULTIPLE MASK EXPOSURES

(75) Inventors: Scott M. Mansfield, Hopewell Junction, NY (US); Timothy A. Brunner, Ridgefield, CT (US); James A. Culp, Poughkeepsie, NY (US); Alfred K. Wong, Pokfulam (HK)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 09/766,005

(22) Filed: Jan. 18, 2001

(65) Prior Publication Data

US 2002/0094482 A1 Jul. 18, 2002

(51) Int. Cl.⁷ .............................................. G03F 9/00
(52) U.S. Cl. ......................................................... 430/5
(58) Field of Search ............................ 430/5, 322, 394; 355/53, 72

(56) References Cited

U.S. PATENT DOCUMENTS

| | | | |
|---|---|---|---|
| 5,242,770 A | 9/1993 | Chen et al. | 430/5 |
| 5,308,741 A | 5/1994 | Kemp | 430/312 |
| 5,413,898 A | 5/1995 | Kim et al. | 430/325 |
| 5,424,154 A | 6/1995 | Borodovsky | 430/5 |
| 5,447,810 A | 9/1995 | Chen et al. | 430/5 |
| 5,451,488 A | 9/1995 | Fukuba | 430/312 |
| 5,532,090 A | 7/1996 | Borodovsky | 430/5 |
| 5,532,114 A | 7/1996 | Bae | 430/312 |
| 5,563,012 A | 10/1996 | Neisser | 430/22 |
| 5,620,816 A | 4/1997 | Dao | 430/5 |
| 5,759,744 A * | 6/1998 | Brueck et al. | 430/312 |
| 5,851,707 A | 12/1998 | Shibuya et al. | 430/5 |
| 6,200,710 B1 * | 3/2001 | Hada | 430/5 |

FOREIGN PATENT DOCUMENTS

JP 06083032 3/1994 ............. G03F/1/08

* cited by examiner

Primary Examiner—S. Rosasco
(74) Attorney, Agent, or Firm—Margaret A. Pepper

(57) ABSTRACT

The present invention relates generally to a method for lithographically printing a mask pattern on a substrate, in particular a semiconductor substrate, wherein the mask pattern includes features with diverse pitches. These features may include device features such as vias or contact holes and lines in integrated circuits. The method comprises splitting the mask pattern into a plurality of masks, wherein one or more of the masks contains relatively tightly nested features and one or more of the masks contains relatively isolated features. Each of the plurality of masks is then successively exposed on a photoresist layer on the substrate. For each exposure, the exposure conditions, photoresist layer, other thin films layers, etching process, mask writing process, and/or mask pattern bias may be optimized for the tightly nested feature pattern or isolated feature pattern.

23 Claims, 8 Drawing Sheets

METHOD AND APPARATUS FOR LITHOGRAPHICALLY PRINTING TIGHTLY NESTED AND ISOLATED DEVICE FEATURES USING MULTIPLE MASK EXPOSURES

FIELD OF THE INVENTION

The present invention relates generally to the field of semiconductor device manufacturing, and more specifically to a method and apparatus for lithographically printing tightly nested device features and isolated device features in integrated circuits.

BACKGROUND OF THE INVENTION

In the semiconductor industry, there is a continuing effort to produce devices having a higher density of device features. As a result, the printing of device feature patterns with extremely small spacings has been and continues to be required. However, the printing of such tightly nested features or contacts presents problems associated with the process window for the lithography process. The process window is a measure of the amount of process variation that can be tolerated while still maintaining the printed feature sizes within set tolerances. Common measurements of process window include depth of focus (DOF), exposure latitude (EL), and total process window (TW). TW is a measure of the area under the curve in a plot of DOF vs. EL.

When printing relatively isolated small contacts, a sufficient process window can be achieved through the use of attenuated phase-shifting masks along with a reduced partial coherence factor. Partial coherence factor is the ratio of the illumination pupil size to the imaging pupil size, and is a measure of the coherency of the imaging system. As the partial coherence factor approaches zero, the degree of coherence increases. As the coherency of an imaging system increases (and the partial coherence factor decreases), the interaction between neighboring features in an image increases. Thus, with an imaging system having a high degree of coherence, the way a feature is imaged, i.e., its size and shape when printed, depends on the other features surrounding it. With an imaging system having a low degree of coherence, the effect of the size and shape of each feature on its neighbor is much less than that of a coherent system.

In a photolithography process in which a mask pattern is imaged onto a semiconductor substrate, the degree of coherence has additional implications. An imaging system having a high degree of coherence allows stronger phase interactions to occur. In such a system, interaction will be greater between light passing through different points of the mask being imaged when projected onto the semiconductor substrate. Therefore, by carefully controlling the phase of the light passing through regions of the mask surrounding a feature, the way that feature will be imaged can be modified. This phase interaction will not occur with an imaging system having a low degree of coherence, and therefore changing the phase on regions of the mask surrounding the feature will not impact the way that feature is imaged. A mask which allows the phase of the light passing through various regions to be adjusted is called a phase-shifting mask. Thus, an imaging system having a high degree of coherence generally improves the performance of phase shifting masks used in printing relatively isolated device features.

However, tightly nested small contacts cannot be resolved using attenuated phase-shifting masks and reduced partial coherence factor alone. FIGS. 1A and 1B illustrate the problem of reduced process window associated with tightly spaced device features. FIG. 1A illustrates TW as a function of x pitch and y pitch, and FIG. 1B illustrates DOF at 10% EL as a function of x pitch and y pitch. The pitch is the distance from one feature to the next adjacent feature in either the x direction or y direction as shown in FIG. 3A. In both FIGS. 1A and 1B, the partial coherence factor ($\sigma$) is set to a relatively low value of 0.45. FIGS. 1A and 1B show that as the pitch is reduced in either the x direction or y direction, or both, the process window decreases rapidly. For example, in FIG. 1A, when the x pitch and y pitch are both a relatively large 740 nm, TW is about 28%-$\mu$m, which is acceptable for present-day processes. When the x pitch is reduced to 400 nm, leaving the y pitch at 740 nm, TW drops to about 14%-$\mu$m. Likewise, when the y pitch is reduced to 400 nm, leaving the x pitch at 740 nm, TW also drops to about 14%-$\mu$m. When both the x pitch and y pitch are reduced to 400 nm, TW drops even further to about 10%-$\mu$m, which is unacceptable for present-day processes.

This phenomenon is believed to be caused by diffraction of the light. As the pitch is reduced, the diffracted light is believed to spread wider at the pupil plane of the imaging lens. If the pitch becomes too small, a limit is reached where only one diffracted order falls within the lens pupil, resulting in no modulation of the light at the wafer plane and the mask pattern being completely unresolved. This limit or cutoff occurs when $$\text{pitch} = \lambda/(NA*(1+\sigma))$$

where $\lambda$ is the imaging wavelength, NA is the numerical aperture (a measurement of the size of the imaging pupil), and $\sigma$ is the partial coherence factor.

A known solution to improving the process window in the printing of features having a tight pitch is to increase the partial coherence factor and thereby reduce the minimum resolvable pitch. In FIGS. 2A and 2B, the partial coherence factor ($\sigma$) has been increased to 0.75. FIG. 2A illustrates TW as a function of x pitch and y pitch, and FIG. 2B illustrates DOF at 10% EL as a function of x pitch and y pitch. FIGS. 2A and 2B each show that when a contact is nested more tightly in any direction, i.e. as the pitch is reduced in any direction, the process window to print the contact remains acceptable. Note that there is no rapid decrease in process window as either the x pitch or y pitch, or both, decreases. However, at this relatively high partial coherence factor, the resolution in printing isolated small features suffers due to a reduction in phase interaction. Thus, when printing a mask pattern having both tightly nested and isolated device features, lithographers are often required to compromise between a sufficient process window for one and good imaging resolution for the other.

One solution to this dilemma was proposed in U.S. Pat. No. 5,424,154 to Borodovsky. Borodovsky discloses a method of improving lithographic resolution for isolated features on a mask which also contains tightly nested features. In this method, complementary or "dummy" features are added to isolated device features on a first mask so that the pitch of the isolated features is reduced to approximately the same as that of the tightly nested features. The dummy features are then obliterated by exposure to a second mask.

A similar solution was proposed in U.S. Pat. Nos. 5,242,770 and 5,447,810, both to Chen et al. Chen discloses methods of reducing proximity effects when printing both isolated features and tightly nested features on a mask. The process window of isolated features is improved by adding additional or "dummy" features adjacent to isolated features edges in the mask. The dummy features are the same transparency as the original feature and have dimensions less than the resolution of the exposure tool. Therefore, these dummy features are not transferred onto the photoresist layer.

Thus, in both the Borodovsky and Chen methods, dummy features must be added to the mask pattern to convert isolated features into tightly nested features. In addition, the Borodovsky method requires a second exposure to remove the dummy features created with the first exposure.

Another solution to the dilemma between sufficient process window and good imaging resolution was proposed in U.S. Pat. No. 5,563,012 to Neisser. Neisser describes methods of splitting a mask pattern having both isolated and tightly nested features into two or more modified or overlay masks. The mask features are divided among the two or more overlay masks such that each mask contains features having the same pitch. In a first embodiment, a mask pattern is split into two or more overlay masks, each having features which are relatively isolated, i.e., which have a relatively large pitch. The tightly nested features are divided into two or more overlay masks so that the resulting pitch of these features is approximately the same as the pitch of the isolated features. The isolated features are then added to any one of the overlay masks. Each overlay mask pattern is then lithographically printed onto a substrate using the same exposure conditions for each mask. In a second embodiment, a mask pattern is split into two or more overlay masks, each having features which are tightly nested. The isolated features of the mask pattern are added to one or more of the overlay masks, along with "dummy" features, so that the resulting pitch of these features is approximately the same as the tightly nested features. The tightly nested features are then added to any one of the overlay masks. Each overlay mask pattern is then printed onto a substrate, again using the same exposure conditions for each mask.

Two observations can be made regarding the Neisser methods. In the second Neisser embodiment, as in the Borodovsky and Chen methods, dummy features must be added to the mask pattern. In the first Neisser embodiment, dummy features are not required. However, in this first embodiment, more than two overlay masks may be required under certain conditions. In a mask pattern having isolated features and an array of tightly nested features, splitting the array of tightly nested features into only two overlay mask patterns may not result in a pitch sufficiently large to match that of the isolated features. The array may need to be split into three or more mask patterns to achieve a large enough pitch. For example, an array of three tightly nested features in a "T" or triangular formation can not be split into less than three mask patterns in order to achieve the goal of reducing the pitch of these features. As another example, in a mask pattern having a square array of tightly nested features with a pitch 2× that of the feature size and having isolated features with a pitch of 4× that of the feature size, splitting the array of tightly nested features into only two mask patterns will result in a pitch of at most 2.8× that of the feature size. (2.8 is the length of the diagonals in an array of squares having sides of length 2.) This will result in at least one of the two overlay masks having isolated features with a pitch of 4× and a portion of the tightly nested features having a pitch of 2.8×, which may not be a sufficiently close pitch in order to optimize both the process window and imaging resolution.

Therefore, there is a need in the art for a method of printing a mask pattern having tightly nested and isolated device features, wherein both the process window and imaging resolution can be optimized for each category of features. Further, there is a need in the art for a method of successfully printing a mask pattern having tightly nested and isolated features, which does not require the addition of dummy features to the mask pattern, and which allows flexibility in the number of masks required.

SUMMARY OF THE INVENTION

The present invention solves the problem of optimizing both the process window and imaging resolution for tightly nested and isolated features in a mask pattern, and does so without requiring the addition of dummy features to the mask pattern, while maintaining flexibility in the number of masks required.

In one aspect of the present invention, a method of lithographically printing a pattern on a substrate is disclosed, wherein the pattern includes features with diverse pitches. This method comprises the steps of: (1) grouping the features into a plurality of feature groups according to pitch, said plurality of feature groups including at least one feature group wherein the pitch is less than at least one predetermined value and at least one feature group wherein the pitch is greater than at least one predetermined value; (2) forming a plurality of masks, each mask including a different one of said plurality of feature groups; (3) depositing at least one photosensitive layer on the substrate; (4) successively positioning each of the plurality of masks above the substrate; and (5) successively exposing each of the plurality of masks on said at least one photosensitive layer.

In another aspect of the present invention, a method of forming a plurality of lithography masks from a single lithography mask pattern having features with diverse pitches is disclosed. This method comprises the steps of: (a) comparing the pitch of each feature to at least one predetermined value; (b) adding each feature to one of a plurality of feature groups according to pitch, said plurality of feature groups including at least one feature group wherein the pitch is less than said at least one predetermined value and at least one feature group wherein the pitch is greater than said at least one predetermined value; and (c) forming a plurality of lithography masks, each mask including a different one of said plurality of feature groups.

In yet another aspect of the present invention, an apparatus for lithographically printing a mask pattern having features with diverse pitches is disclosed. The apparatus comprises a plurality of lithography masks formed by a method comprising the steps of: (a) comparing the pitch of each feature to at least one predetermined value; (b) adding each feature to one of a plurality of feature groups according to pitch, said plurality of feature groups including at least one feature group wherein the pitch is less than said at least one predetermined value and at least one feature group wherein the pitch is greater than said at least one predetermined value; and (c) forming a plurality of lithography masks, each mask including a different one of said plurality of feature groups.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE PREFERRED EMBODIMENTS

In the present invention, the process window dilemma associated with printing a photolithography pattern having tightly nested and isolated device features is solved by splitting the mask pattern into a plurality of masks, wherein one or more of the masks contains relatively tightly nested device features and one or more contains relatively isolated device features.

Figure 3A:
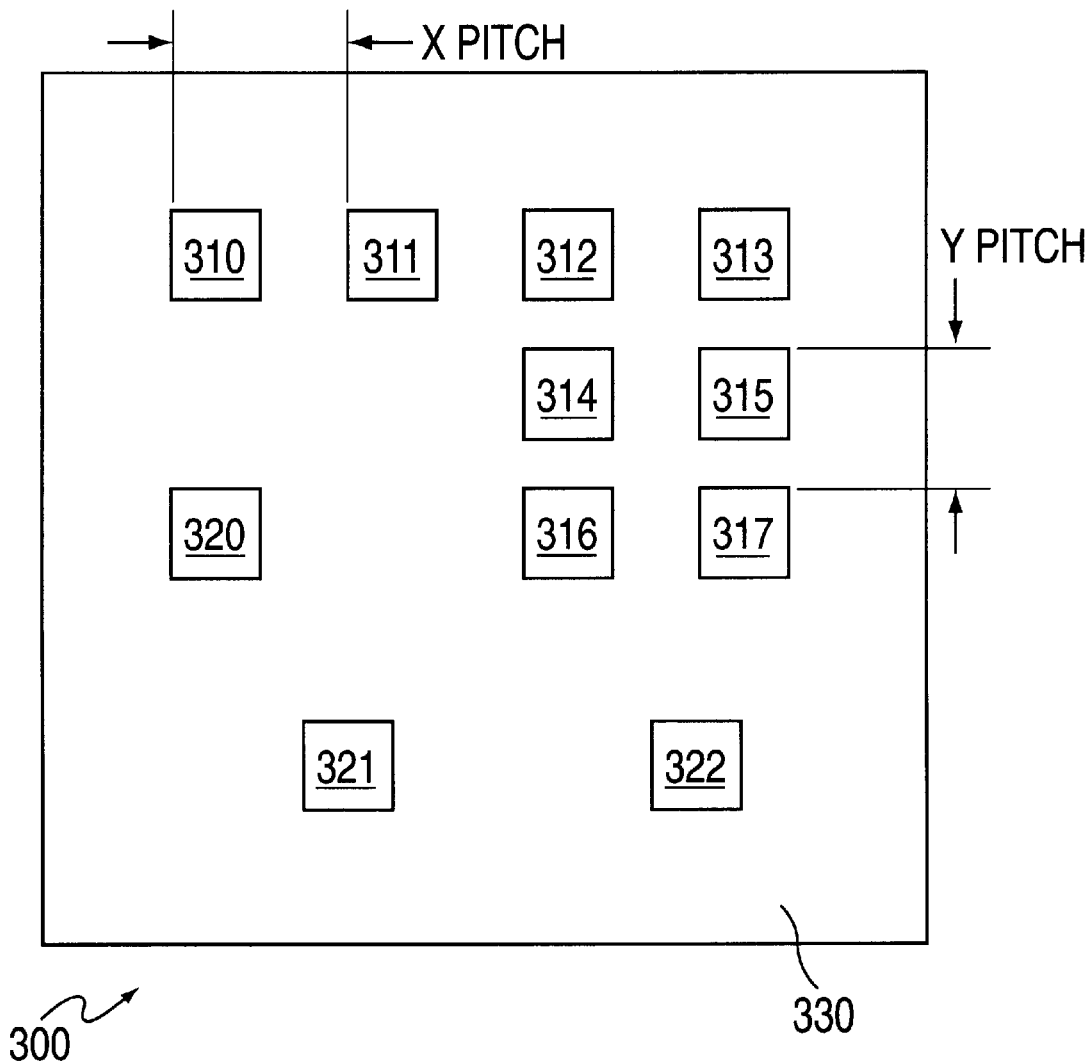
FIG. 3A is a simplified plan view of a photolithography mask having both tightly nested and isolated device features.
Figure 3B:
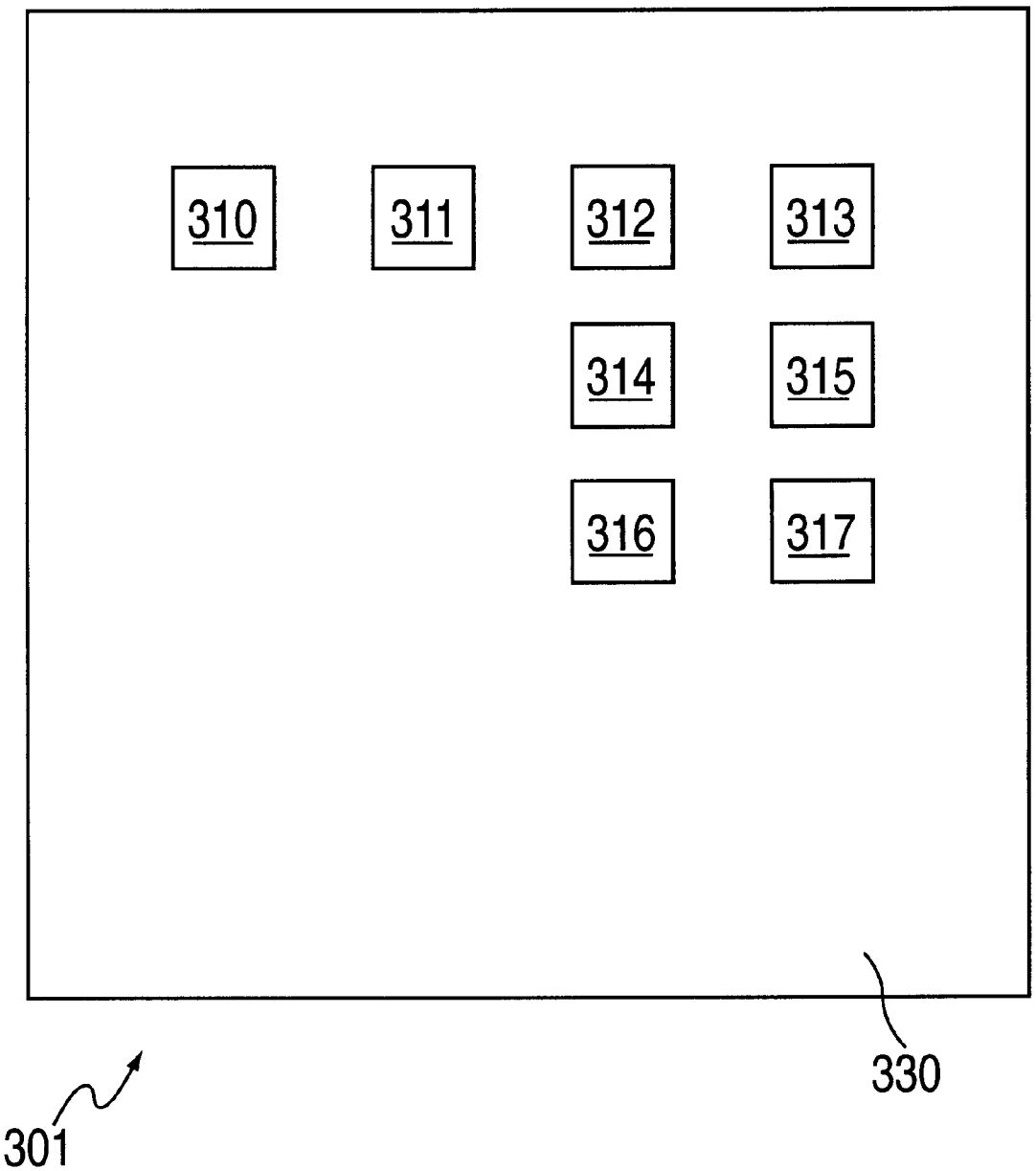
FIG. 3B is a simplified plan view of a photolithography mask having only the tightly nested device features of the FIG. 3A mask.
Figure 3C:
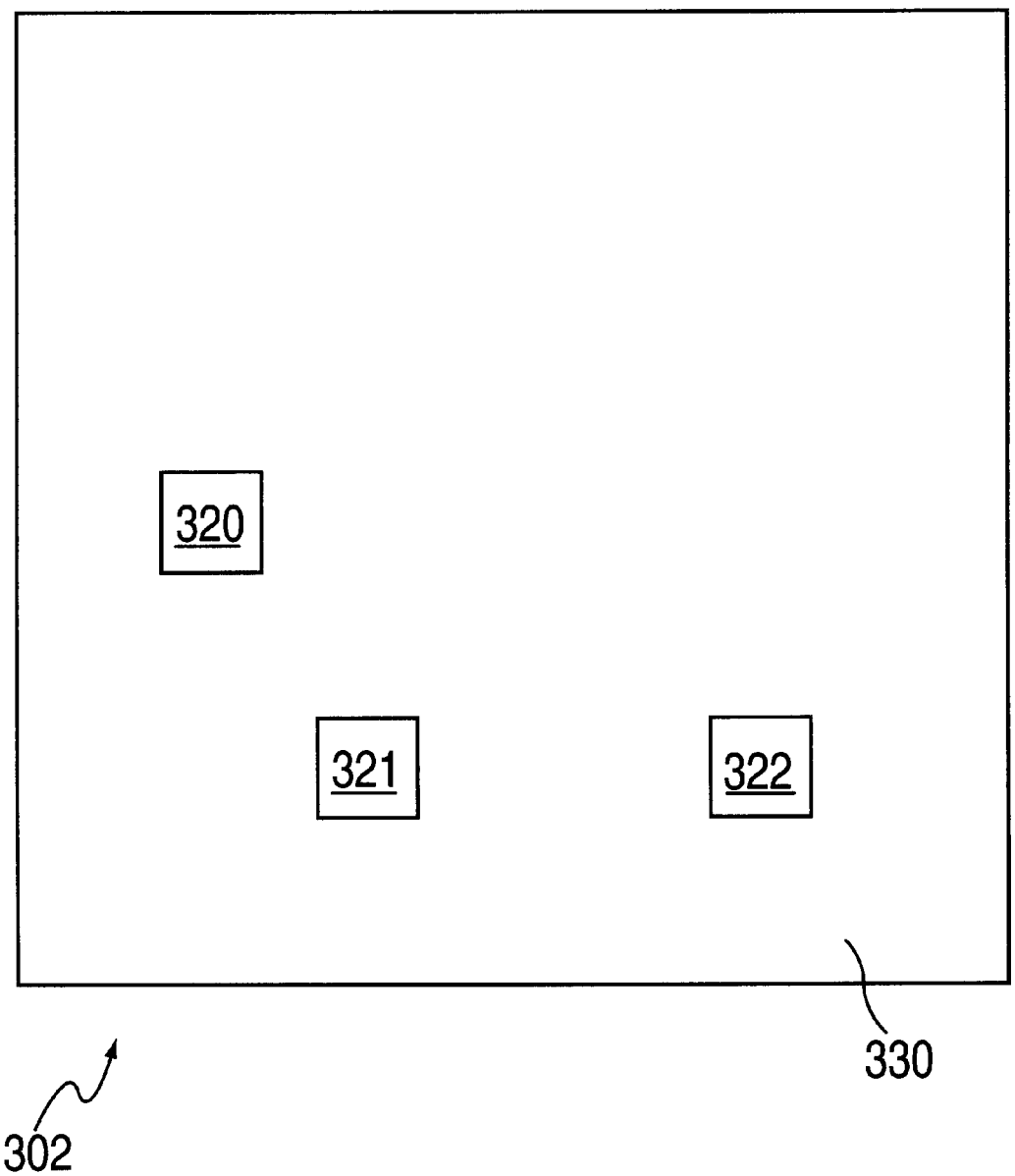
FIG. 3C is a simplified plan view of a photolithography mask having only the isolated device features of the FIG. 3C mask.

This concept is illustrated in FIGS. 3A–3C. FIG. 3A shows a mask pattern 300 having a plurality of light penetrating areas 310–317 and 320–322 for transmitting illumination light, and a masking area 330 for blocking illumination light. Light penetrating areas 310–317 and 320–322 represent small contact hole features or vias to be lithographically printed on a semiconductor substrate. However, the present invention is equally applicable to mask patterns having other device features such as lines. The contact hole feature size for contact hole features 310–317 and 320–322 is about 200 nm.

Contact hole features 310–317 are located in close proximity to neighboring contact hole features and therefore have a relatively tight pitch. The pitch of contact hole features 310–317 is less than about 450 nm. Contact hole features 320–322 are located farther apart and therefore are relatively isolated. The pitch of contact hole features 320–322 is greater than or equal to about 450 nm. A sufficient process window for printing contact hole features of this size is represented by a DOF of about 0.5 to 0.55 μm at 10% EL, for this example exposure system of λ=248 nm and NA=0.68.

In mask 300, the contact hole feature size is about 200 nm. However, the feature size on the mask often differs from the feature size to be printed on the wafer stack. If it is desired to print a contact hole pattern at a dimension larger than its mask dimension, the radiation dose is increased to an "over-exposure" condition. Similarly, if it is desired to print a contact hole pattern at a dimension smaller than its mask dimension, the dose is decreased to an "under-exposure" condition. The difference between the dimension printed on the wafer stack and the mask dimension is called the "mask bias." In addition, the stepper magnification is typically 4×. However, in the following discussion of mask 300, the mask bias is zero and the stepper magnification is 1×0 for purposes of illustrating the present invention.

Figure 1A:
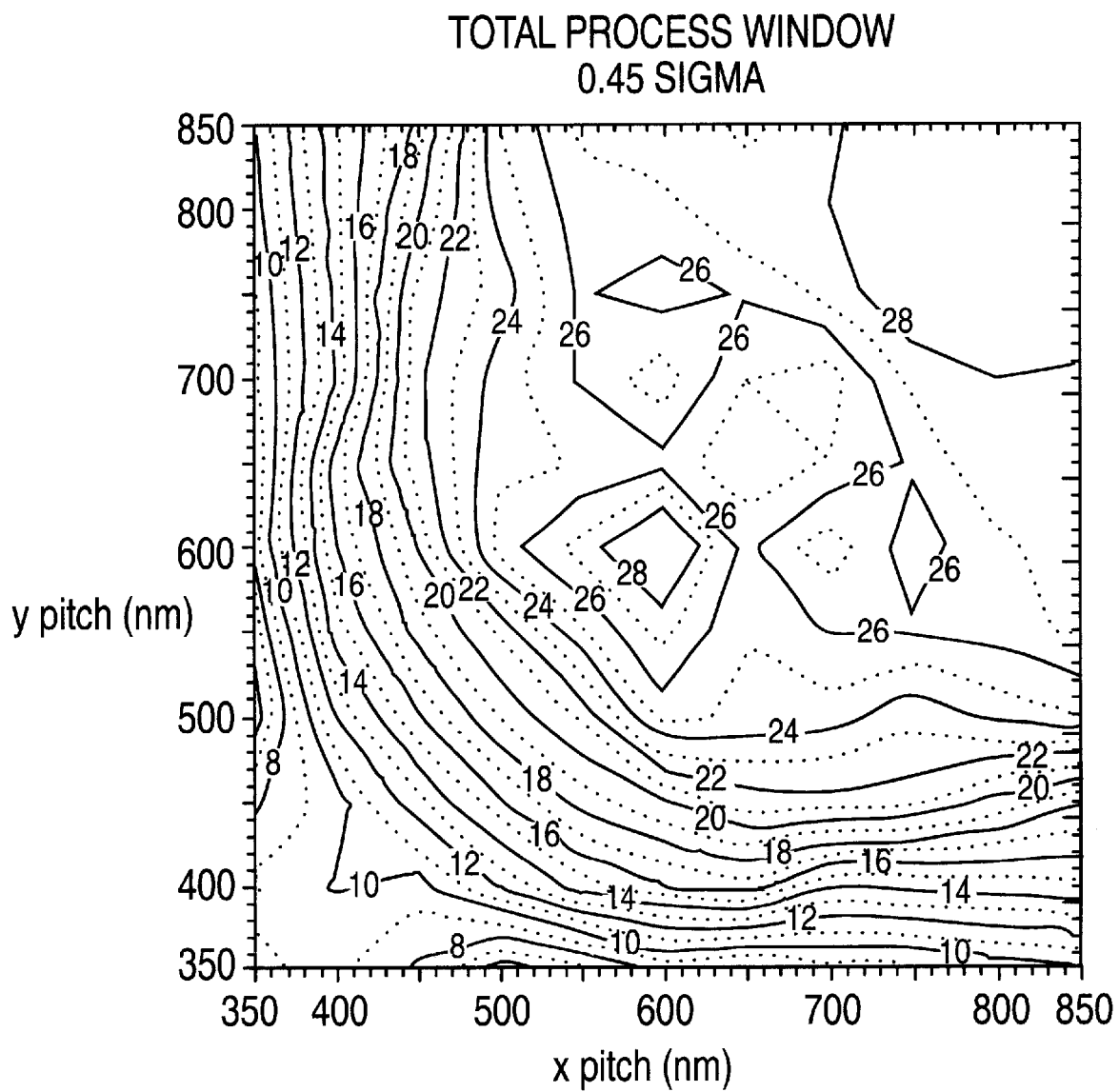
FIG. 1A is a graph illustrating total process window (TW) as a function of x pitch and y pitch for a partial coherence factor (σ) of 0.45.
Figure 1B:
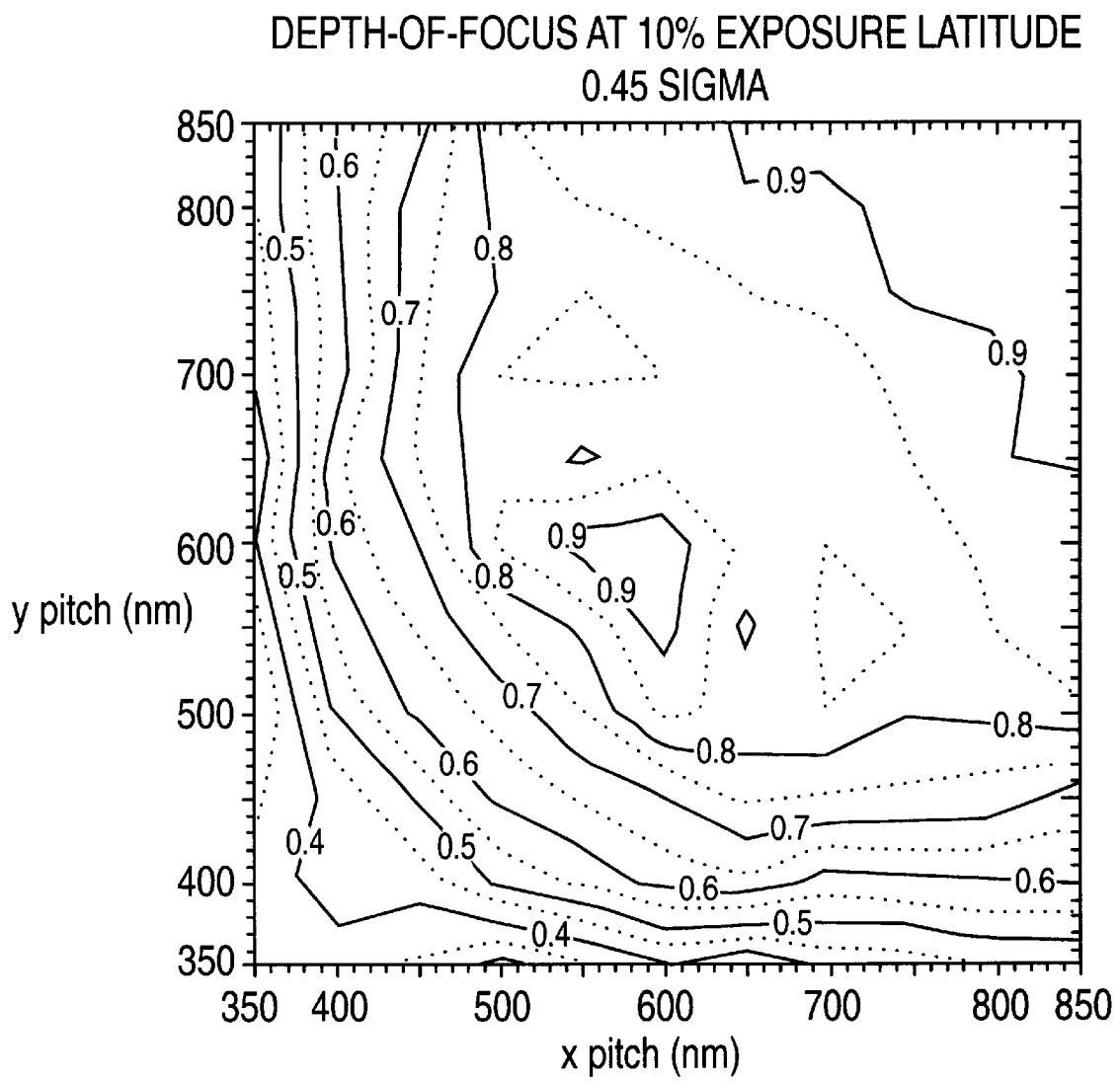
FIG. 1B is a graph illustrating depth-of-focus (DOF) at 10% exposure latitude (EL) as a function of x pitch and y pitch for a σ of 0.45.
Figure 2A:
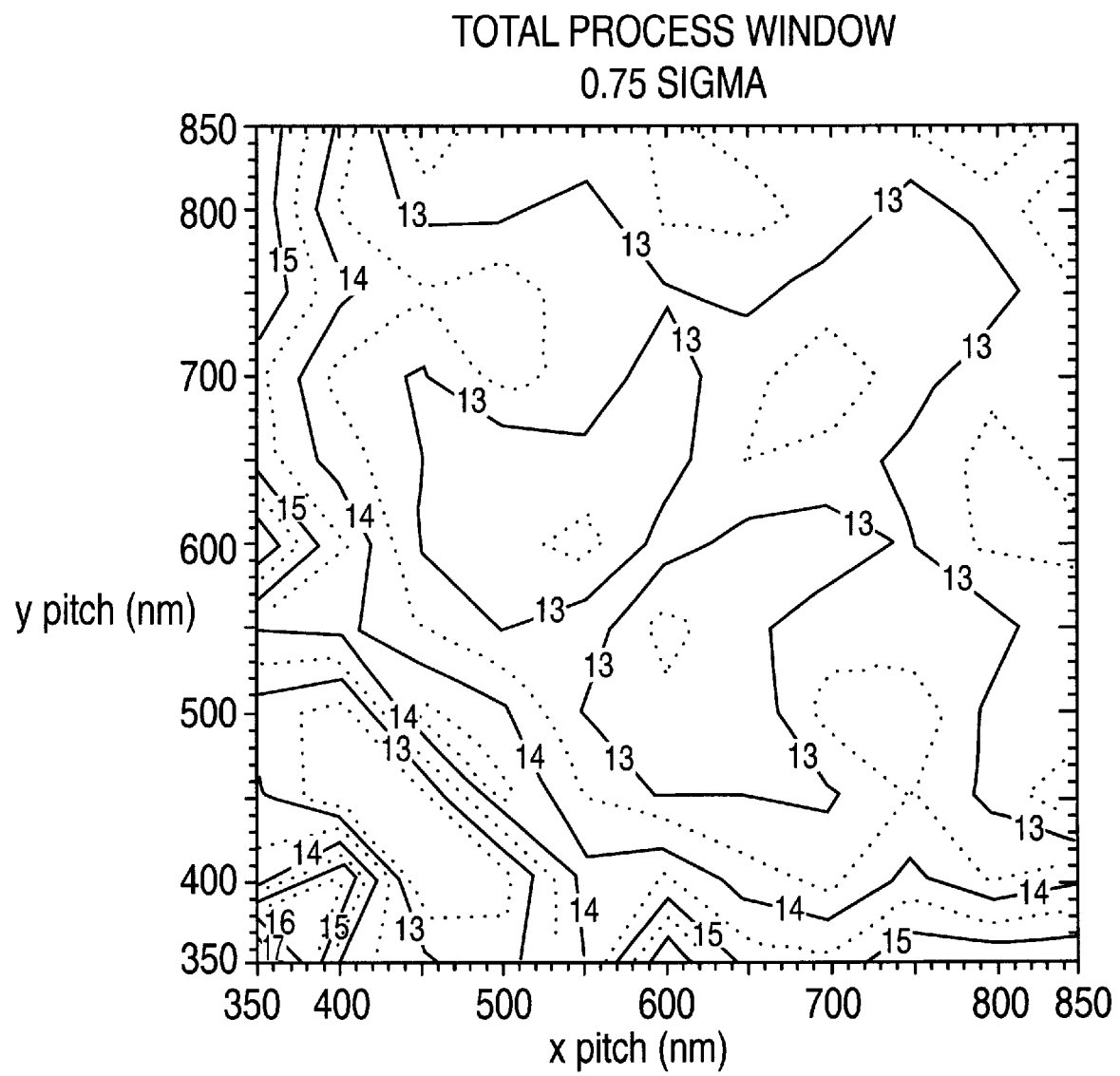
FIG. 2A is a graph illustrating TW as a function of x pitch and y pitch for a σ of 0.75.
Figure 2B:
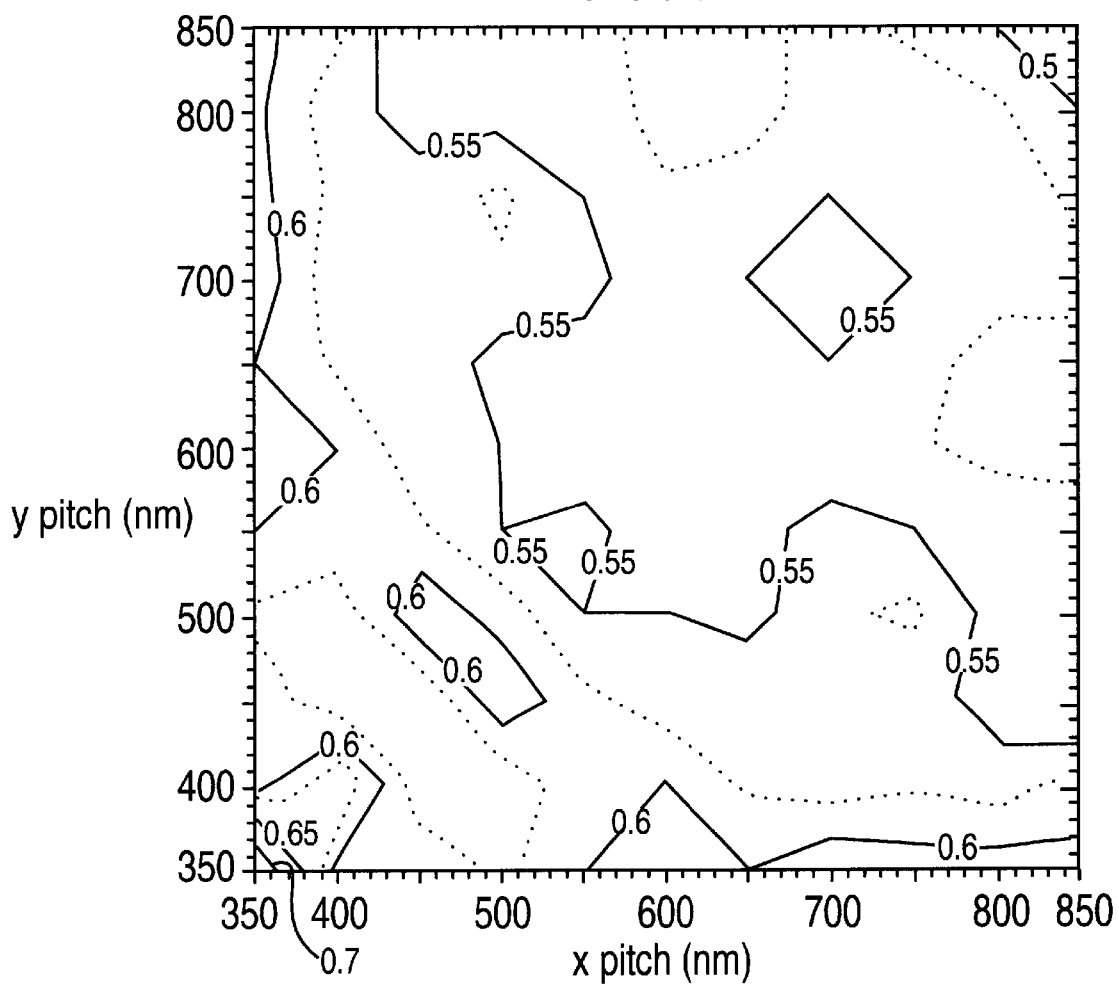
FIG. 2B is a graph illustrating DOF at 10% EL as a function of x pitch and y pitch for a σ of 0.75.

When mask pattern 300 is printed on a substrate in a photolithography printing process using a stepper, a sufficient process window can be achieved for printing the isolated contact hole features 320–322 by adjusting the stepper imaging parameters appropriately. For example, a sufficient process window can be achieved by using a reduced partial coherence factor of, for example, 0.45. The partial coherence factor for printing isolated contact hole features 320–322 is preferably between about 0.2 and about 0.6. However, as illustrated in FIG. 1, the process window for printing the tightly nested contact hole features 310–317 will be insufficient at this reduced partial coherence factor. The process window for printing the tightly nested contact hole features 310–317 can be improved by increasing the partial coherence factor to, for example, 0.75. The partial coherence factor for printing the tightly nested contact hole features 310–317 is preferably between about 0.6 and about 0.85. However, at this increased partial coherence factor, the resolution for printing the isolated contact hole features 320–322 will suffer due to a reduction in the phase interaction.

The present invention solves this problem by splitting the mask pattern 300 into two sub-mask patterns, one having the tightly nested contact hole features 310–317 and the other having the isolated contact hole features 320–322. In FIGS. 3B and 3C, the mask pattern 300 of FIG. 3A has been split into two sub-mask patterns 301 and 302, respectively. In FIG. 3B, sub-mask pattern 301 has the tightly nested contact hole features 310–317 of mask pattern 300. In FIG. 3C, sub-mask pattern 302 has the isolated contact hole features 320–322 of mask pattern 300.

These two sub-mask patterns can then be used in two photolithography printing steps. In the first step, sub-mask pattern 301 is used to print the tightly nested contact hole features 310–317 in a photolithography process having imaging parameters optimized for this relatively tight pitch. For example, a relatively large partial coherence factor of about 0.6 to about 0.85 may be used to print these tightly nested contact hole features 310–317. In the second photolithography step, sub-mask pattern 302 is used to print the isolated contact hole features 320–322 with imaging parameters optimized for this relatively large pitch. For example, a relatively small partial coherence factor of about 0.2 to about 0.6 may be used to print these isolated contact hole features 320–322. The order of these two printing steps is not critical. The isolated contact hole features 320–322 can be printed first, or the tightly nested contact hole features 310–317 can be printed first.

In a preferred embodiment of this invention, photomasks corresponding to sub-masks 301 and 302 are created and subsequently used to form contact hole features on a semiconductor substrate. First, sub-mask 301 of FIG. 3B is positioned over a silicon wafer stack on which a photoresist layer has been previously deposited. The photoresist coating is then exposed to radiation using a stepper. As used herein, radiation refers to all forms of radiation, including light or illumination and x-ray. The radiation is directed onto the silicon wafer stack through sub-mask 301, thereby transferring the mask pattern of sub-mask 301 onto the photoresist layer. Prior to this first exposure, the stepper imaging parameters, such as the numerical aperture (NA) and/or partial coherence factor (σ), should be optimized for the tightly nested contact hole features on sub-mask 301. In addition, off-axis radiation may be used during exposure of sub-mask 301. Next, sub-mask 302 of FIG. 3C is positioned over the silicon wafer stack, and the photoresist coating is again exposed to radiation using a stepper. Prior to this second exposure, the stepper imaging parameters should be adjusted so that they are optimized for the isolated contact hole features on sub-mask 302. Finally, the photoresist layer is developed, the contact hole features are etched in the underlying films of the silicon wafer stack using a conventional etching process, and the contact hole features are filled using a conventional deposition process.

In another embodiment, the present invention allows the photoresist on the substrate to be optimized for each mask exposure. In this embodiment, a first photoresist is deposited onto the silicon wafer stack. A photoresist having characteristics optimized for the tightly nested mask pattern of sub-mask 301 should be chosen. For example, a photoresist having less diffusion may be used for printing tightly nested mask pattern 301, where diffusion is the ability of a chemical compound, such as an acid, to move through the photoresist material. Sub-mask 301 is then positioned over the silicon wafer stack, and the photoresist coating on the wafer stack is exposed to radiation using a stepper. The radiation is directed onto the silicon wafer stack through sub-mask 301, thereby transferring the mask pattern of sub-mask 301 onto the photoresist layer. The stepper imaging parameters may also be optimized for sub-mask pattern 301, as previously discussed. The photoresist is then developed, and the mask pattern of sub-mask 301 is transferred to the silicon wafer stack using conventional etching and deposition processes. Next, a second photoresist is coated onto the silicon wafer stack. This photoresist is preferably one having characteristics optimized for the isolated mask pattern of sub-mask 302. Sub-mask 302 is then positioned over the silicon wafer stack, and the second photoresist layer is exposed to radiation or light directed onto the wafer stack through sub-mask 302, thereby transferring the mask pattern of sub-mask 302 onto the photoresist layer. Again, the stepper imaging parameters may also be optimized for sub-mask pattern 302, as previously discussed. The second photoresist is then developed, and the mask pattern of sub-mask 302 is transferred to the silicon wafer stack.

In addition, the present invention allows other thin films on the silicon wafer stack to be optimized for the printing of isolated versus tightly nested mask patterns. These thin films include various dielectric and metal layers, hardmask layers, and anti-reflective coatings, in addition to the photoresist layer.

In another embodiment, the present invention allows the mask writing process to be adjusted and optimized for each photomask and each exposure. The mask writing process refers to the tools and processes used to create the mask. Masks used in the production of semiconductor devices are typically created with a "direct-write" lithography system wherein a laser beam or an electron beam (e-beam) is used to expose a layer of photoresist on the mask. The photoresist pattern is then transferred into a layer of chromium (Cr), or other materials for phase-shifting masks, using an etch process. This etch process may be either a dry process, such as reactive ion etching (RIE), or a wet process. Masks made with different processes will have different characteristics such as edge roughness, corner rounding and pattern uniformity. The present invention allows a mask maker to use a mask writing process that produces characteristics that work best for masks having tightly nested mask patterns, and a different mask writing process that produces characteristics that work best for masks having isolated mask patterns.

In another embodiment, the present invention allows the mask pattern bias to be adjusted and optimized for each photomask and each exposure. As discussed previously, the size of features on the mask is often different from the desired size of features in the target photoresist layer. This difference is known as the mask bias. Similarly, the size of design features may differ from the ultimate mask dimension. This difference is known as the mask pattern bias, also called the mask process comp. The mask pattern bias is the bias that the mask maker applies to the design data in order to account for nonlinearities in the mask making process. Thus, the present invention allows a mask maker to use one mask pattern bias that works best for tightly nested mask patterns, and a different pattern bias that works best for isolated mask patterns.

In yet another embodiment, the present invention allows the pattern transfer etch process to be optimized for each mask pattern and each exposure. The typical pattern transfer etch process used in the production of semiconductor devices is a RIE process. RIE processes using different chemistries often perform differently for tightly nested and isolated mask patterns. The present invention allows a lithographer to optimize the pattern transfer process for the tightly nested features and the isolated features to provide the most uniformly sized shapes under normal process variations.

Figure 4:
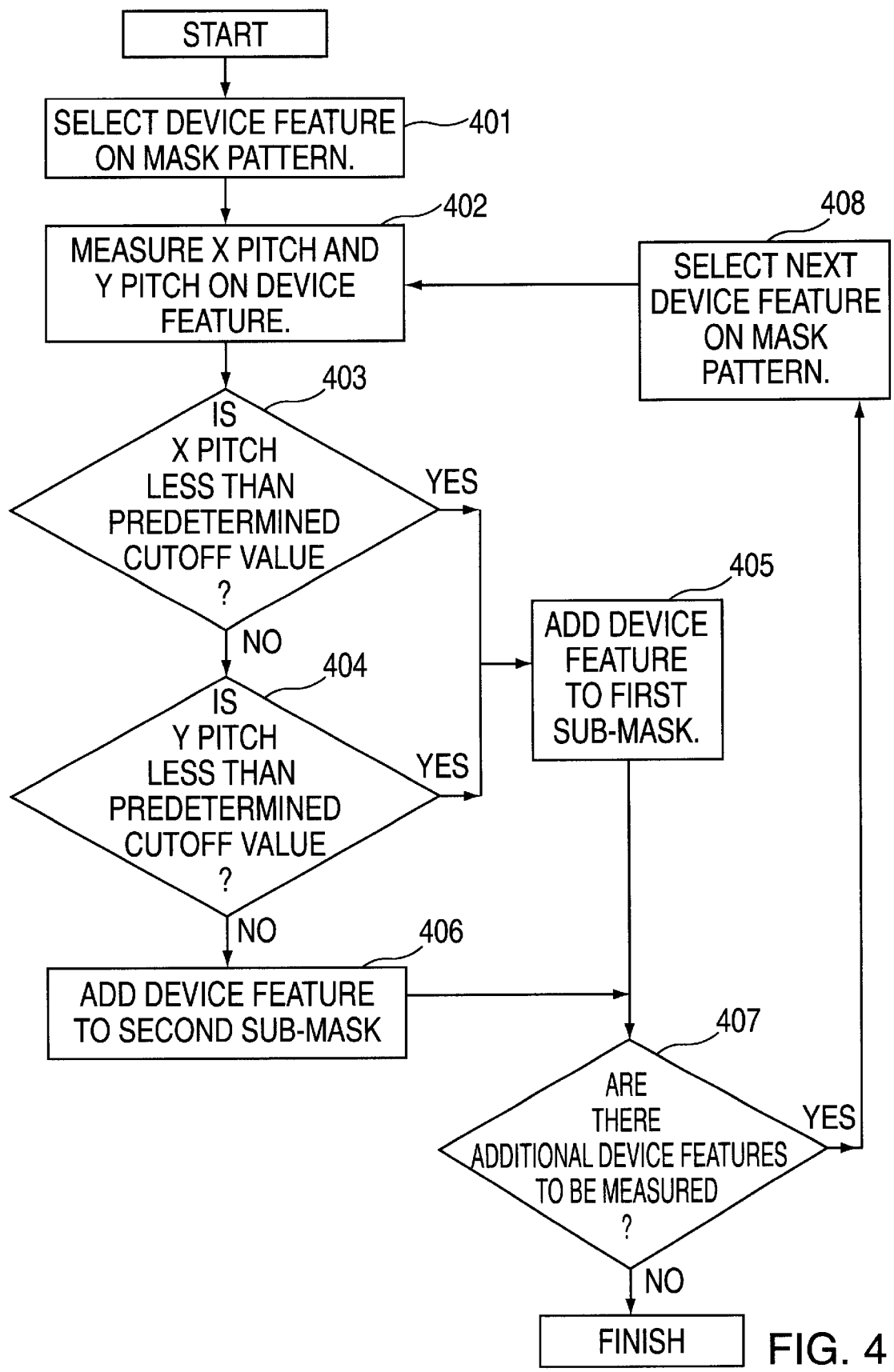
FIG. 4 illustrates the method of the present invention for splitting a mask pattern into two sub-masks.

The method of the present invention for splitting a mask pattern into two or more sub-mask patterns is shown in FIG. 4. This method will be illustrated with reference to the mask pattern 300 of FIGS. 3A–3C. First, a device feature on the mask pattern is selected (step 401). For example, in mask pattern 300, contact hole feature 310 may be selected first. The x pitch and y pitch of the selected device feature are then measured (step 402). Next, the x pitch and y pitch are compared to a predetermined cutoff value (steps 403 and 404). If either the x pitch or y pitch is less than the predetermined cutoff value, the device feature is added to a first sub-mask (step 405). If neither pitch is less than the predetermined cutoff value, the device feature is added to a second sub-mask (step 406). For example, the x pitch of contact hole feature 310 is less than 450 nm, which is the predetermined cutoff value. Contact hole feature 310 is therefore added to sub-mask 301 of FIG. 3B. If additional device features are to be measured, the next device feature is selected, and the process continues from the beginning (steps 407 and 408). Using this method, the pitches of contact hole features 310–317 are measured and are found to be less than 450 nm, the predetermined cutoff value. Therefore, contact hole features 310–317 are added to sub-mask 301 of FIG. 3B. Similarly, the pitches of contact hole features 320–322 are measured and are found to be greater than 450 nm. Contact hole features 320–322 are therefore added to sub-mask 302 of FIG. 3C.

Although FIG. 4 illustrates the method of the present invention for splitting a mask pattern into two sub-masks, it should be readily apparent to those skilled in the art that a mask pattern could be similarly split into more than two sub-masks by selecting more than one predetermined cutoff value and comparing the pitch of each device feature to each of the predetermined cutoff values. For example, a mask pattern could be split into three sub-masks by selecting two predetermined cutoff values. If the pitch of a selected device feature is less than both the first predetermined cutoff value and the second predetermined cutoff value, the device feature is added to a first sub-mask. If the pitch of a selected device feature is greater than the first predetermined cutoff value but less than the second predetermined cutoff value, the device feature is added to a second sub-mask. If the pitch of a selected device feature is greater than both predetermined cutoff values, the device feature is added to a third sub-mask.

This method of the present invention may be automated by establishing two or more data levels, and using these data levels to create the sub-masks. For example, if a mask is to be split into two sub-masks, data level 1 and data level 2 are established. The x and y pitch of the first device feature are measured and compared to a predetermined cutoff value, as described previously. If either pitch is less than the predetermined cutoff value, the device feature is written to data level 1. Otherwise, the device feature is written to data level 2. Each subsequent device feature is similarly examined and written to one of the two data levels. Data level 1 is then used to build the first sub-mask, and data level 2 is used to build the second sub-mask.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method of lithographically printing a pattern on a substrate, wherein said pattern includes features with diverse pitches, said method comprising the steps of:

grouping the features into a plurality of feature groups according to pitch, said plurality of feature groups including at least one feature group wherein the pitch is less than at least one predetermined value and at least one feature group wherein the pitch is greater than said at least one predetermined value;

forming a plurality of masks, each mask including a different one of said plurality of feature groups;

depositing at least one photosensitive layer on the substrate;

successively positioning each of the plurality of masks above the substrate; and successively exposing each of the plurality of masks on said at least one photosensitive layer.

2. The method of claim 1, wherein the plurality of masks are successively exposed without intermediate development of said at least one photosensitive layer.

3. The method of claim 1, wherein the masks are successively exposed using a stepper capable of directing radiation on said at least one photosensitive layer.

4. The method of claim 3, wherein off-axis radiation is used during exposure of masks having feature groups wherein the pitch is less than said at least one predetermined value.

5. The method of claim 3, wherein imaging parameters of the stepper are adjusted prior to each successive exposure.

6. The method of claim 5, wherein the partial coherence factor of the radiation is adjusted prior to each successive exposure.

7. The method of claim 6, wherein the partial coherence factor of the radiation is between about 0.6 and about 0.85 during exposure of masks having feature groups wherein the pitch is less than said at least one predetermined value.

8. The method of claim 6, wherein the partial coherence factor of the radiation is between about 0.2 and about 0.6 during exposure of masks having feature groups wherein the pitch is greater than said at least one predetermined value.

9. The method of claim 5, wherein the imaging parameters of the stepper include a numerical aperture, and the numerical aperture is adjusted prior to each successive exposure.

10. The method of claim 1, wherein a plurality of photosensitive layers are successively deposited on the substrate, and wherein each of the plurality of masks are successively exposed on a different photosensitive layer.

11. The method of claim 10, wherein each photosensitive layer is developed after each successive exposure.

12. The method of claim 1, wherein each of the plurality of masks are formed using a different mask making process.

13. The method of claim 1, wherein each of the plurality of masks has a different mask pattern bias.

14. The method of claim 1, further comprising the step of etching the substrate to transfer the feature group of each mask to the substrate.

15. The method of claim 14, wherein the substrate is etched using a different etching process for each feature group.

16. The method of claim 1, wherein the features are selected from the group consisting of vias and lines.

17. The method of claim 3, wherein the radiation is characterized by wavelength $\lambda$ and the stepper is characterized by numerical aperture NA, and said at least one predetermined value is between $0.55(\lambda/NA)$ and $1.1(\lambda/NA)$.

18. A method of forming a plurality of lithography masks from a single lithography mask pattern having features with diverse pitches, said method comprising the steps of:

comparing the pitch of each feature to at least one predetermined value;

adding each feature to one of a plurality of feature groups according to pitch, said plurality of feature groups including at least one feature group wherein the pitch is less than said at least one predetermined value and at least one feature group wherein the pitch is greater than said at least one predetermined value; and forming a plurality of lithography masks, each mask including a different one of said plurality of feature groups.

19. The method of claim 18, wherein the pitch of each feature is compared to one predetermined value, and each feature is added to one of a first feature group and a second feature group.

20. The method of claim 18, wherein the pitch of each feature is compared to a first predetermined value and a second predetermined value, and each feature is added to one of a first feature group, a second feature group and a third feature group.

21. The method of claim 20, wherein the pitch of the first feature group is less than both the first predetermined value and the second predetermined value, the pitch of the second feature group is greater than the first predetermined value and less than the second predetermined value, and the pitch of the third feature group is greater than both the first predetermined value and the second predetermined value.

22. The method of claim 18, wherein the features are selected from the group consisting of vias and lines.

23. An apparatus for lithographically printing a mask pattern having features with diverse pitches, the apparatus comprising a plurality of lithography masks formed by the method of claim 18.

* * * * *